(12) United States Patent
Kim et al.

(10) Patent No.: US 9,312,415 B2
(45) Date of Patent: *Apr. 12, 2016

(54) MULTI-LAYERED SHEET AND METHOD OF PREPARING SAME

(75) Inventors: Hyun Cheol Kim, Daejeon (KR); Hyun Seong Ko, Seoul (KR); Hyo Soon Park, Daejeon (KR); Yoon Kyung Kwon, Daejeon (KR); Do Won Ahn, Daejeon (KR)

(73) Assignee: LG CHEM, LTD., Seoul (KR)

( * ) Notice: Subject to any disclaimer, the term of this patent is extended or adjusted under 35 U.S.C. 154(b) by 665 days.

This patent is subject to a terminal disclaimer.

(21) Appl. No.: 13/695,739

(22) PCT Filed: Apr. 29, 2011

(86) PCT No.: PCT/KR2011/003215
§ 371 (c)(1),
(2), (4) Date: Mar. 8, 2013

(87) PCT Pub. No.: WO2011/139052
PCT Pub. Date: Nov. 10, 2011

(65) Prior Publication Data
US 2013/0171447 A1    Jul. 4, 2013

(30) Foreign Application Priority Data

May 6, 2010     (KR) .................... 10-2010-0042531
Aug. 13, 2010   (KR) .................... 10-2010-0078389
Apr. 29, 2011   (KR) .................... 10-2011-0040739

(51) Int. Cl.
| | |
|---|---|
| *B05D 3/02* | (2006.01) |
| *B32B 27/30* | (2006.01) |
| *C08F 14/22* | (2006.01) |
| *C08J 7/04* | (2006.01) |
| *H02S 99/00* | (2014.01) |
| *H01L 31/048* | (2014.01) |
| *H01L 31/049* | (2014.01) |
| *C08F 214/22* | (2006.01) |

(52) U.S. Cl.
CPC ............ *H01L 31/0481* (2013.01); *C08J 7/042* (2013.01); *H01L 31/049* (2014.12); *B32B 27/304* (2013.01); *C08F 214/22* (2013.01); *C08F 214/222* (2013.01); *C08J 2367/02* (2013.01); *C08J 2427/16* (2013.01); *C08J 2433/10* (2013.01); *C08J 2433/12* (2013.01); *H02S 99/00* (2013.01); *Y02E 10/50* (2013.01); *Y10T 428/264* (2015.01); *Y10T 428/265* (2015.01);

(Continued)

(58) Field of Classification Search
None
See application file for complete search history.

(56) References Cited

U.S. PATENT DOCUMENTS

| | | | | |
|---|---|---|---|---|
| 5,707,697 A | * | 1/1998 | Spain et al. ............ | 428/31 |
| 6,538,084 B2 | | 3/2003 | Kitahara et al. | |

(Continued)

FOREIGN PATENT DOCUMENTS

| | | |
|---|---|---|
| CN | 102356469 A | 2/2012 |
| JP | 11277693 | 10/1999 |

(Continued)

*Primary Examiner* — Ramsey Zacharia
(74) *Attorney, Agent, or Firm* — Dentons US LLP

(57) ABSTRACT

Provided are a multi-layered sheet, a backsheet for a photovoltaic cell, a method of preparing the same and a photovoltaic module. The multi-layered sheet in which a resin layer including a fluorine-based resin has excellent durability and weather resistance, and also exhibits strong interfacial adhesion to a substrate or polymer coating layer is provided. When a drying process is performed at a low temperature in preparation of the multi-layered sheet, production cost can be reduced, producibility can be increased, and degradation in the quality of a product caused by thermal deformation or thermal shock can be prevented. Such a multi-layered sheet may be effectively used as a backsheet for various photovoltaic cells.

18 Claims, 1 Drawing Sheet

(52) U.S. Cl.
CPC ....... *Y10T 428/266* (2015.01); *Y10T 428/3154* (2015.04); *Y10T 428/31504* (2015.04); *Y10T 428/31507* (2015.04); *Y10T 428/31544* (2015.04); *Y10T 428/31551* (2015.04); *Y10T 428/31678* (2015.04); *Y10T 428/31725* (2015.04); *Y10T 428/31786* (2015.04); *Y10T 428/31855* (2015.04); *Y10T 428/31935* (2015.04)

(56) References Cited

U.S. PATENT DOCUMENTS

| | | | |
|---|---|---|---|
| 6,777,610 | B2 | 8/2004 | Yamada et al. |
| 2007/0154704 | A1* | 7/2007 | Debergalis et al. ........... 428/323 |
| 2008/0264484 | A1 | 10/2008 | Temchenko et al. |
| 2009/0162652 | A1 | 6/2009 | Ranade et al. |
| 2012/0240986 | A1 | 9/2012 | Debergalis et al. |
| 2013/0213468 | A1 | 8/2013 | Nagato et al. |

FOREIGN PATENT DOCUMENTS

| | | |
|---|---|---|
| JP | 11-317475 A | 11/1999 |
| JP | 2002001884 | 1/2002 |
| JP | 209522414 A | 6/2009 |
| KR | 10-2010-0015554 A | 2/2010 |
| KR | 1020100021600 | 2/2010 |
| WO | 2007-063698 A1 | 6/2007 |
| WO | 2007063698 A1 | 6/2007 |
| WO | 2010/043665 A1 | 4/2010 |
| WO | 2010/107282 A2 | 9/2010 |

* cited by examiner

MULTI-LAYERED SHEET AND METHOD OF PREPARING SAME

CROSS-REFERENCE TO RELATED APPLICATION

This application is a National Stage Entry of International Application No. PCT/KR2011/003215, filed Apr. 29, 2011, and claims the benefit of Korean Application Nos. 10-2010-0042531, filed on May 6, 2010, 10-2010-0078389, filed on Aug. 13, 2010, and 10-2011-0040739, filed on Apr. 29, 2011 which are hereby incorporated by reference in their entirety for all purposes as if fully set forth herein.

BACKGROUND

1. Technical Field

The disclosure relates to a multi-layered sheet, a backsheet for a photovoltaic cell, a method of preparing the same and a photovoltaic module.

2. Related Art

Recently, there is growing concern about renewable, clean energy because of global environmental problems and exhaustion of fossil fuels. Among these, solar energy has attracted attention as a representative pollution-free energy source which can solve problems of environment contamination and exhaustion of fossil fuels.

A photovoltaic cell to which a principle of photovoltaic power is applied is a device for converting sunlight into electricity. Since the photovoltaic cell is necessarily exposed for a long time to the outdoor environment to facilitate absorption of sunlight, it is made into a unit by performing several packaging processes to protect the cell. The unit is referred to as a photovoltaic module.

Generally, the photovoltaic module uses a backsheet having excellent weather resistance and durability to stably protect the photovoltaic cell during long-term exposure to the outdoor environment. The backsheet generally includes a backsheet in which a resin layer including a fluorine-based polymer such as polyvinyl fluoride (PVF) is stacked on a substrate.

However, because of its poor adhesion to a polyethylene terephthalate (PET) film typically used as a substrate for the backsheet, the PVF resin is used by laminating a fluorine-based polymer film obtained by extrusion or casting on a substrate using a urethane-based adhesive. However, for this technique, high-priced film preparation equipment, an adhesive and additional adhesive coating and laminating processes are needed. In addition, for this technique, it is necessary to use a thicker film than is required in order to handle the film, the use of various additives and fillers are limited, and a high processing temperature is required.

On the other hand, when a fluorine-based polymer film, which is prepared in the form of resin suspension or solution, is coated and dried on a substrate, a solvent having generally a high boiling point is used and a high drying temperature of 200° C. or more is needed.

A large amount of energy is used to provide a high drying temperature required by the PVF resin solution. This increases the production cost of the photovoltaic module backsheet and causes thermal shock or thermal deformation of the substrate. Consequently, the quality (mechanical characteristics, etc.) of a product is degraded, and its mechanical properties rapidly deteriorate over long-term outdoor use.

Therefore, there is continuing demand for a material for a photovoltaic cell backsheet which has excellent durability and weather resistance and can be dried at a low temperature, thereby reducing its production cost and enhancing the productivity and quality of a photovoltaic module.

SUMMARY

The embodiments of the disclosure are directed to providing a multi-layered sheet, a backsheet for a photovoltaic cell, a method of preparing the same and a photovoltaic module.

In one aspect, a multi-layered sheet is provided, the sheet including a substrate; and a fluorine-based resin layer. The multi-layered sheet includes a polymer coating layer that is compatible with a fluorine-based resin between the substrate and the fluorine-based resin layer. The fluorine-based resin layer includes a fluorine-based resin having an amorphous region and a crystallinity of less than 60%.

In another aspect, a method of preparing a multi-layered sheet is provided, the method including: preparing a substrate; forming a polymer coating layer by coating a polymer composition that is compatible with a fluorine-based resin on the substrate; and coating a coating solution including a fluorine-based resin having an amorphous region and a crystallinity of less than 60% and a solvent having a boiling point of 200° C. or less on the polymer coating layer.

The multi-layered sheet may be, for example, used as a backsheet for various photovoltaic modules.

BRIEF DESCRIPTION OF THE DRAWINGS

The above and other objects, features and advantages of the present invention will become more apparent to those of ordinary skill in the art by describing in detail illustrative embodiments thereof with reference to the attached drawings, in which.

DETAILED DESCRIPTION

Figure 1:
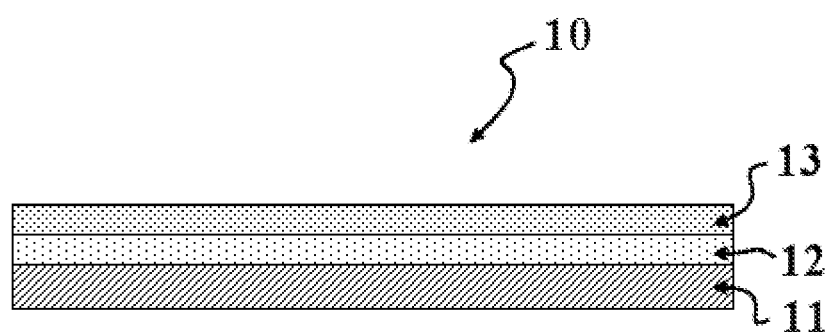
FIGS. 1 and 2 are cross-sectional views of a multi-layered sheet according to one embodiment of the present invention.

Hereinafter, the illustrative embodiments of the present invention will be described in detail with reference to the accompanying drawings. For the sake of clarity and concision, the content which is known to those of ordinary skill in the art and that which is not essential to fully understand and embody the invention will be omitted from both the description and the drawings. The drawings are schematic and not to scale, and thus the thicknesses of layers and regions are enlarged or exaggerated for clarity. Accordingly, the scope of the present invention is not limited to the thicknesses, sizes, proportions represented in the drawings.

Although the terms first, second, etc. may be used to describe various elements, these elements are not limited by these terms. These terms are only used to distinguish one element from another. For example, the first element could be termed the second element, and, similarly, the second element could be termed the first element, without departing from the scope of the illustrative embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the illustrative embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

In one embodiment of the present invention, a multi-layered sheet includes a substrate, and a fluorine-based resin layer. The multi-layered sheet includes a polymer coating layer that is compatible with the fluorine-based resin between the substrate and the fluorine-based resin layer. The fluorine-based resin layer includes a fluorine-based resin having an amorphous region and a crystallinity of less than 60%.

Specific kinds of the substrate included in the multi-layered sheet of the present invention are not particularly limited, and thus various materials known in the art may be selected and used according to required functions and purposes.

In one example of the present invention, the substrate may be a metal or polymer sheet. The metal may be aluminum or iron, and examples of the polymer sheet may include a polyester-based sheet, a polyamide-based sheet or a polyimide-based sheet. Among these sheets, a polyester-based sheet is generally used, but the present invention is not limited thereto. Examples of the polyester-based sheet may include, but are not limited to, a single sheet, a stacked sheet, and a coextrusion product of polyethylene terephthalate (PET), polyethylene naphthalate (PEN) or polybutylene terephthalate (PBT).

A thickness of the substrate may be in a range of approximately 50 to 500 μm, or 100 to 300 μm. The thickness of the substrate may be controlled in the above range, thereby maintaining an electrical insulating property, a water barrier property, mechanical characteristics, and handling of the multi-layered sheet. Meanwhile, the thickness of the substrate is not limited within the above-described range, and thus may be suitably controlled as necessary.

In the present invention, high-frequency spark discharge treatment such as corona or plasma treatment, thermal treatment, flame treatment, coupling agent treatment, anchoring agent treatment, or chemical activation treatment using gas-phase Lewis acid (e.g., $BF_3$), sulfuric acid or high-temperature sodium hydroxide, may be performed to the substrate.

In addition, an inorganic oxide such as a silicon oxide or aluminum oxide may be deposited on the substrate to further enhance the water barrier property. At this time, the above-described spark discharge treatment, flame treatment, coupling agent treatment, anchoring agent treatment or chemical activation treatment may also be performed to the deposited layer to further enhance adhesion.

The multi-layer sheet may include a polymer coating layer between the substrate and the fluorine-based resin layer. The polymer coating layer is formed on the substrate, is compatible with the fluorine-based rein, and ensures adhesion between the substrate and the fluorine-based resin layer.

A polymer in the polymer coating layer includes a main chain backbone that is compatible with the fluorine-based resin, and the fluorine-based resin layer is formed on the polymer coating layer.

In the disclosure, the phrase "B that is compatible with A" means that if A and B are present in a single system, Gibb's free energy generated when A and B are mixed or diffused into each other is at a lower level than when A and B are not mixed or diffused into each other.

In the embodiments of the present invention, the main chain backbone included in the polymer coating layer may be compatible with the fluorine-based resin, and particularly, with the fluorine-based resin or a mixture of the fluorine-based resin and an amorphous resin. Therefore, the main chain backbone may be generally highly compatible with the fluorine-based resin layer.

In the embodiments of the present invention, the main chain backbone included in the polymer coating layer is not particularly limited as long as the polymer coating layer exhibits the above-described characteristics. Examples of the main chain backbone include, but are not limited to, at least one selected from the group consisting of a (meth)acryl-based main chain backbone; a urethane-based main chain backbone; an ether sulfone-based main chain backbone; an ether imine-based main chain backbone; an amide-based main chain backbone; a polyester-based main chain backbone; an aliphatic polyester-based main chain backbone; a polyester urethane-based main chain backbone; a (meth)acrylamide-based main chain backbone; a urea-based main chain backbone; a polycarbonate-based main chain backbone; and a main chain backbone of a free radical addition polymer induced from a monomer mixture including a (meth)acryl-based monomer, a (meth)acrylamide-based monomer or a vinyl-based monomer as a main component. In one embodiment, the main chain backbone includes at least one selected from the group consisting of an acryl-based main chain backbone; a polyester-based main chain backbone; an aliphatic polyester-based main chain backbone; a (meth)acrylamide-based main chain backbone; and a main chain backbone of a free radical addition polymer induced from a monomer mixture including an acryl-based monomer or (meth)acrylamide-based monomer as a main component.

The term "monomer mixture including a specific monomer as a main component" used herein means that the specific monomer is included in an amount of greater than 50 wt %, 70 wt % or more, or 90 wt % or more, based on the total weight of the specific monomer.

The polymer coating layer has compatibility to exhibit sufficient adhesion between a fluorine-based resin included in a fluorine-based resin layer to be described later, or a mixture of a fluorine-based resin and an amorphous resin, and the above-described substrate. Accordingly, during the formation of the multi-layered sheet, at an interface between the polymer coating layer and the fluorine-based resin layer, interdiffusion between the fluorine-based resin included in the fluorine-based resin layer and/or the amorphous resin and materials included in the polymer coating layer occurs. Therefore, it is expected that physical interaction occurs due to chain entanglement between molecular chains of components of the fluorine-based resin layer and polymer coating layer and a Van der Waals interaction, and thus adhesion is enhanced.

In addition, the Van der Waals interaction may be further increased due to a dipole-dipole interaction. Therefore, in one example of the present invention, the polymer coating layer may further include a functional group, which may be introduced into an inside part, side chain or terminal end of a main chain of the polymer. That is, the polymer coating layer may include a polymer including a main chain backbone that is compatible with the fluorine-based resin and having a functional group introduced into the inside part, side chain or terminal end of the main chain backbone; or a polymer including a main chain backbone that is compatible with the fluorine-based resin and crosslinked with a compound capable of providing a functional group, or a mixture of a polymer including a main chain backbone that is compatible with the fluorine-based resin and a functional group or a compound capable of providing the functional group.

In the embodiments of the present invention, a kind of the functional group is not particularly limited, but may include those having a high dipole moment and thus can improve adhesion to the fluorine-based resin layer through interaction with a dipole having a $C-F_2$ bond of the fluorine-based resin. Accordingly, the Van der Waals interaction may be further increased due to the interaction between the dipole of the $C-F_2$ bond of the fluorine-based resin included in the fluorine-based resin layer and the dipole of the functional group of the polymer coating layer. That is, it is expected that the fluorine-based resin layer and the polymer coating layer have increased physical or chemical interactions when well-diffused into one another due to the excellent compatibility and the interaction of the dipoles, thereby enhancing adhesion.

In the embodiments of the present invention, the functional group may include, but is not limited to, at least one selected from the group consisting of a carboxyl group, a sulfonic acid group, an aziridine group, an acid anhydride group, an amine group, an isocyanate group, a cyanuramide group, an epoxy group, a hydroxy group, an ester functional group, a carbamate functional group, an amide group, a urea group, an imide group, a phosphate group, a phosphoric acid group, a cyano group, a cyanate group and an imine group, and specifically, at least one selected from the group consisting of a carboxylic group, a sulfonic acid group, an acid anhydride group, an amine group, an epoxy group, a hydroxy group, a cyano group and an ester functional group.

In the embodiments of the present invention, a kind of the material capable of introducing or providing the functional group to the main chain backbone is not particularly limited, and may be any one of many compounds widely known in the art which can introduce a corresponding functional group. Examples of such a compound include glycidyl (meth)acrylate, glycidyl alkyl (meth)acrylate, (meth)acrylic acid, isocyanate alkyl (meth)acrylate, hydroxy alkyl (meth)acrylate, maleic acid anhydride, p-toluene sulfonic acid, phosphoric acid, (meth)acrylamide, (meth)acrylonitrile and alkylaminoalkyl (meth)acrylate. A functional group may be introduced by a method of polymerizing such a compound along with polymerization of a main chain of a polymer, or grafting the compound to a side chain or terminal end of the main chain under a suitable addition reaction condition, or a method of crosslinking a polymer using the compound. In some cases, the compounds may be included separate from a polymer or mixed with the polymer in the polymer coating layer. In the art, various methods capable of introducing a desired functional group to a polymer are disclosed, and all may be applied to the present invention.

In still another exemplary embodiment of the present invention, a polymer coating layer may include, for example, polyester polyol, acryl-based polyol or polycarbonate polyol, or a reaction product of the polymer and polyisocyanate. In this case, a kind of polyisocyanate may include, but is not particularly limited to, aliphatic, cycloaliphatic and aromatic polyisocyanates having at least two isocyanate groups, which are known in the art. In addition, the reaction conditions for the polyisocyanate are not particularly limited.

Also, the polymer coating layer may further include a polymer such as an acryl-based resin, a polyester-based resin, a urethane-based resin, a urea-based resin, an amide-based resin, an epoxy-based resin, an ether sulfone-based resin, an ether imine resin or a silicon-based resin.

An amount of the functional group included in the polymer coating layer is not particularly limited, but an equivalent amount of the functional group in the polymer coating layer may be in a range of 800 to 30000. The term "equivalent amount of the functional group" used herein means a value obtained by dividing the total molecular weight of the functional groups included in the polymer coating layer by the number of corresponding functional groups, and may be measured by a general chemical titration method known in the art. However, the equivalent amount of the functional group is just an example, and thus may be suitably varied according to desired adhesive strength or a kind of a fluorine-based resin included in a resin layer.

The polymer coating layer may have a thickness of approximately 10 to 5000 nm, approximately 50 to 2000 nm, or approximately 150 to 2000 nm, and the thickness of the polymer coating layer may be suitably varied according to the desired adhesive strength and the kind of the fluorine-based resin of the resin layer.

As described below, a chemical or physical interaction such as a Van der Waals interaction, a hydrogen bond, an ionic bond, or a covalent bond, which is formed between a functional group included in a fluorine-based resin or an amorphous resin, filler or dispersing agent included in a resin layer and a functional group of the polymer coating layer, may also enhance adhesion.

The multi-layered sheet includes a fluorine-based resin layer formed on the polymer coating layer. The fluorine-based resin layer includes a fluorine-based resin having an amorphous region and a crystallinity of less than 60%. When the resin layer including the fluorine-based resin is applied, interdiffusion with the polymer coating layer effectively progresses, and thus the increase in adhesion may be maximized. In addition, when the flourine-based resin is used, a solvent having a low boiling point may be used during the formation of a fluorine-based resin layer to be described later. Accordingly, a drying process may be conducted or performed at a low temperature, and thus enhanced productivity and excellent product quality may be ensured.

The fluorine-based resin having the amorphous region may have a crystallinity of less than 55%, 50% or less, or 10 to 50%. The term "crystallinity" used herein means a percentage (based on weight) of a crystalline region included in the entire resin, and may be measured by a known method such as differential scanning calorimetry. Particularly, the degree of crystallinity may be measured by a method described below with respect to other exemplary embodiments of the present invention.

The fluorine-based resin having the above-described crystallinity may be prepared by decomposing a regular atomic arrangement of the fluorine-based resin by copolymerizing a suitable comonomer during the preparation of the fluorine-based resin or polymerizing a polymer in a branched polymer.

A specific kind of the fluorine-based resin having the amorphous region may be, but is not particularly limited to, a homopolymer, a copolymer or a mixture thereof, which includes at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoropylvinylether (PPVE), perfluoromethylvinylether (PMVE), perfluoro-2,2-dimethyl-1,3-dioxol (PDD) and perfluoro-2-methylene-4-methyl-1,3-dioxolane (PMD) in a polymerized type.

The fluorine-based resin may be a homopolymer or copolymer including vinyl fluoride in a polymerized type; a homopolymer or copolymer including vinylidene fluoride in a polymerized type; or a mixture including at least two thereof, and more specifically a copolymer including vinylidene fluoride in a polymerized type.

A kind of the comonomer which can be included in the copolymer in a polymerized type is not particularly limited, and may include at least one or two of hexafluoropropylene (HFP), chlorotrifluoroethylene (CTFE), tetrafluoroethylene (TFE), trifluoroethylene, hexafluoroisobutylene, perfluorobutylethylene, perfluoromethylvinylether (PMVE), perfluoro-2,2-dimethyl-1,3-dioxol (PDD) and perfluoro-2-methylene-4-methyl-1,3-dioxolane (PMD). In one embodiment, the kind of the comonomer includes, but is not limited to, at least one of hexafluoropropylene and chlorotrifluoroethylene. A content of the comonomer in the copolymer may be approximately 0.5 to 50 wt %, 1 to 40 wt %, 7 to 40 wt %, 10 to 30 wt %, or 10 to 20 wt %, based on the total weight of the copolymer. Within the above-described range of the content of the comonomer, durability and weather resistance of the multi-layered sheet may be ensured, and an interdiffusion reaction and low-temperature drying may be effectively induced.

In the embodiments of the present invention, the fluorine-based resin may have a weight average molecular weight of 50,000 to 1,000,000. The weight average molecular weight used herein is a converted value of standard polystyrene measured by gel permeation chromatograph (GPC). The weight average molecular weight of the resin may be controlled within the above range, thereby ensuring excellent solubility and other physical properties.

The fluorine-based resin may have a fusing point of 80 to 175° C., or 120 to 165° C. In the embodiments of the present invention, when the fusing point of the resin is controlled to 80° C. or more, it can prevent deformation of the multi-layered sheet in use. When the fusing point of the resin is controlled to 175° C. or less, solubility in a solvent may be controlled, and gloss of a coating surface may be enhanced.

The fluorine-based resin layer may further include an amorphous resin along with the above-described fluorine-based resin, when necessary. Likewise, when the fluorine-based resin is blended with the amorphous resin, processability, e.g., interaction with the above-described polymer coating layer and solubility in the low-boiling point solvent, may be further maximized. The term "amorphous resin" used herein includes resins having an entirely amorphous structure, as well as resins which have a minor crystalline region and a dominant amorphous region so that the resin on whole is amorphous.

A kind of the amorphous resin which can be used in the present invention is not particularly limited, and may be an acryl-based resin, polycarbonate, polyvinyl chloride, a styrene-(meth)acrylonitrile copolymer, a styrene-maleic anhydride copolymer, a cycloolefin polymer, polyacrylonitrile, polystyrene, polysulfone, polyethersulfone, polyarylate, or a mixture of at least one or two. Among these, an acryl-based resin can be used, but the present invention is not limited thereto.

An example of the acryl-based resin is a homopolymer or copolymer including a polymerized type of at least one or two of methyl (meth)acrylate, ethyl (meth)acrylate, propyl (meth)acrylate, butyl (meth)acrylate, (meth)acrylic acid and isobornyl (meth)acrylate. In some cases, to control a glass transition temperature and a molecular weight distribution, the acryl-based resin may be used, which includes a polymerized type of a monomer of at least one or two kinds of the monomers described above and a comonomer of at least one of cyclohexyl maleimide, methyl styrene and (meth)acrylonitrile.

In the embodiments of the present invention, when the amorphous resin is a copolymer formed by polymerizing at least two monomers, a kind and content of the comonomer is not particularly limited, and thus may be controlled according to desired crystallinity.

In the embodiments of the present invention, when the resin layer includes an amorphous resin, the resin layer includes a fluorine-based resin in an amount of 50 parts by weight or more, and an amorphous resin in an amount of 50 parts by weight or less. More specifically, the resin layer may include a fluorine-based resin in an amount of 70 to 97 parts by weight and an amorphous resin in an amount of 3 to 30 parts by weight. When the weight ratio between resins is controlled to the above-described range, the components comprising the fluorine-based resin layer may have suitable crystallinity, the interdiffusion into a polymer coating layer may effectively progress, and a multi-layered sheet may exhibit physical properties such as excellent durability and weather resistance.

In the embodiments of the present invention, unless specifically defined otherwise, "parts by weight" indicates the ratio of the weight of one component to the total weight of all other components.

The fluorine-based resin layer may further include a pigment or filler to control a color or opacity of the resin layer (or for other purposes). The pigment or filler used herein may be a metal oxide such as titanium dioxide ($TiO_2$), silica or alumina, calcium carbonate, barium sulfate or a black pigment such as a carbon black or a pigment component showing a different color, but the present invention is not limited thereto. The pigment or filler may serve to further improve interfacial adhesion during the interdiffusion between the fluorine-based resin layer and the polymer coating layer by an original functional group included in each component, together with an original effect of controlling the color or opacity of the fluorine-based resin layer. A content of the pigment may be 60 wt % or less based on a solid content of the fluorine-based resin layer, but the present invention is not limited thereto.

The fluorine-based resin layer may further include a common component such as a UV stabilizer, thermal stabilizer or barrier particle.

In the embodiments of the present invention, the fluorine-based resin layer including the above-described components may have a thickness of approximately 3 to 50 μm, or 10 to 30 μm, which may be varied according to its purpose.

The overall crystallinity of the fluorine-based resin layer in the present invention may be less than 60%, 55% or less, 10 to 50%, 10 to 40%, or 10 to 35%. In the disclosure, the term "crystallinity of the fluorine-based resin layer" means a percentage (based on weight) of a crystalline region among all resin components included in the fluorine-based resin layer, that is, a fluorine-based resin or a mixed resin of a fluorine-based resin and an amorphous resin, and may be measured by a known method such as differential scanning calorimetry. In addition, in the embodiments of the present invention, when the fluorine-based resin layer includes at least two resin components, the crystallinity means a weight average of the percentage of the crystalline region of each component. The crystallinity of the fluorine-based resin layer may be achieved through control of the crystallinity of the fluorine-based resin having an amorphous region described above, the mixture of at least two kinds of fluorine-based resins, or the mixture of a fluorine-based resin and an amorphous resin.

In the embodiments of the present invention, the fluorine-based resin layer may be a coating layer. The term "coating layer" used herein means a resin layer formed by coating. More particularly, the coating layer is formed by coating a coating solution, which has been prepared by dissolving the components constituting the resin layer in a solvent, specifically a solvent having a low boiling point, on a substrate or polymer coating layer, not by laminating a sheet prepared by casting or extrusion on a substrate or polymer coating layer using an adhesive.

Figure 2:
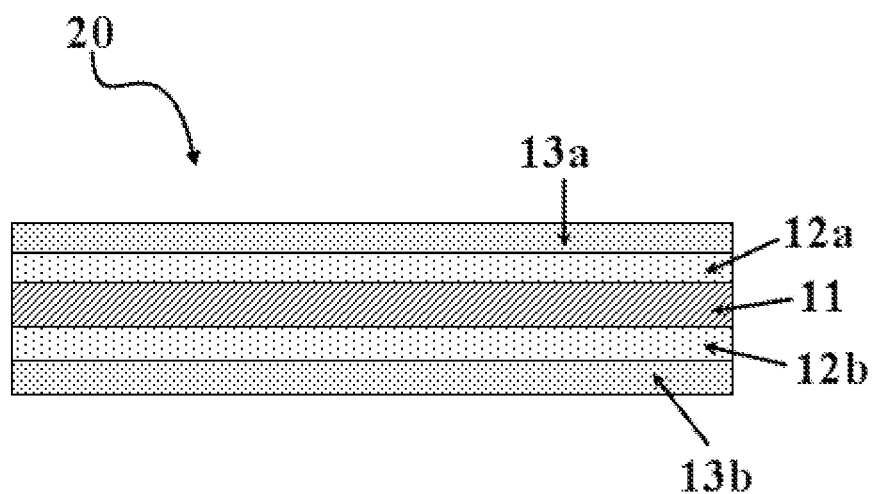

The accompanying FIGS. 1 and 2 illustrate a multi-layered sheet of the present invention. That is, as shown in FIG. 1, the multi-layer sheet 10 of the present invention includes a substrate 11; a polymer coating layer 12 formed on one surface of the substrate; and a fluorine-based resin layer 13 formed on the polymer coating layer 12. Alternatively, as shown in FIG. 2, the multi-layered sheet 20 may include polymer coating layers 12*a* and 12*b* formed on both surfaces of a substrate 11, and fluorine-based resin layers 13*a* and 13*b* formed respectively on the polymer coating layers 12*a* and 12*b*.

The multi-layered sheet may further include various functional layers known in the art, when necessary. A functional layer may be an adhesive layer or an insulating layer. For example, in the multi-layered sheet, the polymer coating layer and the fluorine-based resin layer described above may be formed on one surface of the substrate, and the adhesive layer and the insulating layer may be sequentially formed on the other surface thereof. The adhesive layer or insulating layer may be formed by various methods known in the art. For example, the insulating layer may be a layer of ethylenevinylacetate (EVA) or low-density linear polyethylene (LDPE). The EVA or LDPE layer may serve as an insulating layer, and simultaneously serve to increase adhesion to an encapsulant, reduce a production cost, and maintain excellent re-workability.

In addition, the other embodiments of the present invention relates to a method of preparing a multi-layered sheet including preparing a sheet, forming a polymer coating layer by coating a polymer composition that is compatible with a fluorine-based resin on the substrate; and coating a coating solution including a fluorine-based resin having an amorphous region and a crystallinity of less than 60% and a solvent having a boiling point of 200° C. or less on the polymer coating layer.

A method of forming the polymer coating layer on the substrate is not particularly limited. For example, according to various methods known in the art, the polymer coating layer may be formed by coating a polymer composition that is compatible with the fluorine-based resin on a substrate and drying the coated composition under predetermined conditions. Here, the coating method is not particularly limited, and thus may use any method capable of forming a uniform coating layer, such as offset coating, gravure coating, roll coating, or knife edge coating.

A polymer of the polymer composition may be a polymer having a main chain backbone described above and a functional group introduced into the main backbone or polymer having the above-described main chain backbone, and a compound having a functional group. The coating solution may be prepared by dissolving or dispersing the polymers in a suitable organic solvent or aqueous solvent.

In addition to the above-mentioned methods, various other methods known in the art may be applied in the present invention, and the coating solution may further include various additives, when necessary.

A specific kind of the substrate which can be used in this step of the present invention is the same as described above, and the substrate may be further treated with suitable deposition, plasma, corona, primer, anchoring agent, coupling agent or thermal treatment.

The fluorine-based resin layer is formed by coating the polymer coating layer formed by the above-described method. The coating solution forming the fluorine-based resin layer may be prepared by dissolving or dispersing the components forming the above-described fluorine-based resin layer in a solvent having a relatively low boiling point, specifically, 200° C. or less. That is, in the present invention, as a fluorine-based resin has an amorphous region or is mixed with an amorphous resin, the fluorine-based resin may be effectively dissolved in the solvent having a relatively low boiling point. Accordingly, the present invention does not need a high-temperature drying process during the preparation. Thus, production cost can be reduced and thermal deformation or thermal shock of a substrate which may be caused during the high-temperature drying process can be prevented, thereby improving the quality of the product.

The solvent used in the embodiments of the present invention may be, but is not limited to, acetone, methylethylketone (MEK), dimethylformamide (DMF), dimethylacetamide (DMAC), or a mixture of at least one or two.

In the embodiments of the present invention, the coating solution applied to form the fluorine-based resin layer may further include various additives such as a pigment, a filler, a UV stabilizer and a thermal stabilizer, in addition to the fluorine-based resin and/or amorphous resin. Each additive may be dissolved in the solvent with the fluorine-based resin, or prepared in a mill base, separate from the above-described components, and then mixed with the solvent including the fluorine-based resin or amorphous resin.

A method of preparing the coating solution or a ratio of respective components included in the coating solution is not particularly limited, and thus various methods known in the art may be suitably employed.

The coating method using the coating solution is not particularly limited, but may be performed according to the coating method for forming the above-described polymer coating layer. Particularly, in the coating process, the solvent in the coating solution may serve to swell a surface of the polymer coating layer previously formed, thereby stimulating interdiffusion between the polymer coating layer and the resin layer.

In the embodiments of the present invention, after the coating process, a step of drying the coated coating solution may be further performed. The drying the coating layer may be conducted under conditions such as at 200° C. or less, approximately 100 to 180° C., for approximately 30 seconds to 30 minutes, approximately 1 to 10 minutes, but the present invention is not limited thereto. As the drying conditions are controlled as described above, an increase in production cost may be prevented, and degradation in the quality of a product caused by thermal deformation or thermal shock may also be prevented.

In addition, another embodiment of the present invention relates to a backsheet for a photovoltaic cell including the multi-layered sheet and a photovoltaic module including the backsheet for the photovoltaic cell.

A structure of the photovoltaic module is not particularly limited as long as the multi-layered sheet is included as a backsheet. Thus, the photovoltaic module of the present invention may have various structures known in the art.

Generally, the photovoltaic module may include a transparent top-emission substrate, a backsheet, and a photovoltaic cell encapsulated by an encapsulating agent between the top-emission substrate and the backsheet or a photovoltaic array aligned in series or parallel.

Representative examples of an active layer constituting the photovoltaic cell or photovoltaic array may include a crystalline or amorphous silicon wafer, a compound semiconductor such as CIGS or CTS.

The multi-layered sheet may include a module having the above-described active layer, and thus may be applied to various photovoltaic modules known in the art without limitation. In this case, a method of constituting the module and kinds of other materials are not particularly limited.

Hereinafter, the embodiments of the present invention will be described in detail with reference to Examples according to the present invention and Comparative Examples not according to the present invention. However, the scope of the present invention is not limited to the following Examples.

In the Examples and Comparative Examples, properties of each sheet were measured by the following methods.

1. 180-Degree Peel Strength

A peel strength was measured by cutting a specimen to a width of 10 mm according to ASTM D1897 and peeling the resulting specimen at a speed of 4.2 mm/sec and a peel angle of 180-degrees.

2. Cross-Hatch Adhesive Strength

A cross-cut test was performed according to the standard cross-cut test ASTM D3002/D3359. Specifically, a specimen was cut at 1-mm intervals in horizontal and vertical directions by 11 columns and rows using a knife to form 100 square grids of 1 mm in length and width. After a CT-24 adhesive tape produced by Nichiban was attached to surfaces of the grids and then detached, a state of the surfaces detached along with the tape was examined and evaluated according to the following criteria.

<Criteria for Evaluating Cross-Hatch Adhesive Strength>

5B: when there is no surface detached

4B: when an area of the detached surfaces is no more than 5% based on the total area of the surface 3B: when an area of the detached surfaces is 5 to 15% based on the total area of the surface 2B: when an area of the detached surfaces is 15 to 35% based on the total area of the surface 1B: when an area of the detached surfaces is 35 to 65% based on the total area of the surface 0B: when almost all of the surfaces are detached 3. Damp Heat Test The change in adhesive strength was observed after each of the multi-layered sheets prepared in Examples and Comparative Examples was baked in an oven maintained at 85° C. and 85% RH (relative humidity) for 1000, 2000 or 3000 hours.

4. Pressure Cooker Test (PCT)

The change in adhesive strength was observed after each of the multi-layered sheets prepared in Examples and Comparative Examples was baked in an oven maintained at 2 atm, 121° C., and 100% RH for 50, 75 or 100 hours.

5. Measurement of Crystallinity

The crystallinity of a fluorine resin was measured by differential scanning calorimetry. At this time, a heating rate was set to 10° C. per minute, and in a second heating process, a heat of fusion ($\Delta Hf$) was measured. Based on the heat of fusion of polyvinylidene fluoride having 100% crystallinity ($\Delta Hf = 105$ J/g), the crystallinity of each resin was calculated. In addition, when a resin layer included at least two kinds of fluorine resins, or a fluorine resin and an amorphous resin, the crystallinity of the resin layer was calculated based on the heat of fusion of polyvinylidene fluoride having 100% crystallinity ($\Delta Hf = 105$ J/g).

Example 1

Preparation of Substrate

A coating solution (acryl-modified polyester) including an aqueous dispersion of polyester (PET), glycidyl methacrylate (GMA), methyl methacrylate (MMA) and methyl methacrylic acid (MAA) in a molar ratio of 1:0.5:1:0.2 (PET: GMA:MMA:MAA) was applied to corona-treated polyethylene terephthalate (PET; thickness: 250 μm). The application was performed for the coated layer to have a thickness of approximately 500 nm using a mayer bar. After the coating, the coated layer was dried at approximately 230° C. for approximately 30 seconds, thereby forming a polymer coating layer (acryl-modified polyester layer).

Preparation of Coating Solution for Fluorine-based Resin Layer

A first coating solution was prepared by dissolving 130 g of a copolymer in which vinylidene fluoride (VDF) and chlorotrifluoroethylene (CTFE) were polymerized in a weight ratio of 85:15 (VDF:CTFE), 50 g of a copolymer in which VDF and hexafluoropropylene (HFP) were polymerized in a weight ratio of 88:12 (VDF:HFP) and 20 g of polymethylmethacrylate (PMMA) in 800 g of N,N-dimethyl formamide (DMF).

Apart from the above-described solution, a mill base was prepared by dissolving 4.8 g of a pigment dispersing agent (BYK W9010, produced by BYK) and 240 g of titanium dioxide (TiPure TS6200, produced by Dupont) in 100 g of DMF, adding 100 g of zirconia beads having a diameter of 0.3 mm, stirring the resulting mixture at 1000 rpm for 1 hour, and completely removing the beads.

The prepared mill base was put into the first coating solution previously prepared, and then stirred, thereby preparing a coating solution for a fluorine-based resin layer. Here, the mill base was prepared in an amount 1.5 times the amount actually put into the resin layer, in consideration of the loss of the mill base caused during the bead removal process.

Coating and Drying

The coating solution for a fluorine-based resin layer was applied to the polymer coating layer of the prepared substrate by a comma reverse method. The coating solution was coated to have a thickness after drying of approximately 20 to 30 μm, and then the coated substrate sequentially passed through three ovens, which had a length of 2 m and were respectively controlled to temperatures of 80, 170 and 170° C., at a speed of 1 m/min, thereby forming a fluorine-based resin layer. Afterwards, the coating was performed on the opposite surface of the fluorine-based resin layer in the same manner, thereby preparing a multi-layered sheet in which the fluorine-based resin layers were formed on both surfaces of the PET sheet via the acryl-modified polyester layer.

Examples 2 to 18

Multi-layered sheets were prepared by the method according to Example 1, except that the kinds and mixing ratio of the fluorine-based resin and the acryl-based resin included in the preparation of the coating solution for the resin layer were changed as listed in the following Tables 1 and 2.

TABLE 1

| Polymer | Monomer Ratio (Weight Ratio) | Crystallinity (%) | Weight Average Molecular Weight ($M_w$) | Fusing Point (° C.) |
|---|---|---|---|---|
| 1 VDF-HFP Copolymer | 90:10 (VDF:HFP) | 36 | 330,000 | 158 |
| 2 VDF-HFP Copolymer | 88:12 (VDF:HFP) | 24 | 590,000 | 135 |
| 3 VDF-HFP Copolymer | 85:15 (VDF:HFP) | 22 | 300,000 | 132 |
| 4 VDF-CTFE Copolymer | 80:20 (VDF:CTFE) | 17 | 280,000 | 166 |
| 5 VDF-CTFE Copolymer | 85:15 (VDF:CTFE) | 23 | 270,000 | 166 |
| 6 Branched PVDF | 100(VDF) | 44 | 550,000 | 160 |
| 7 PVDF | 100(VDF) | 56 to 61 | 320,000 | 169 |

VDF: Vinylidene Fluoride
CTFE: Chlorotrifluoroethylene
HFP: Hexafluoropropylene
PVDF: Polyvinylidene Fluoride Homopolymer

TABLE 2

| | Coating Solution Composition | Content (g) | TiO Content (g) | Crystallinity of Fluorine-based Resin Layer (%) |
|---|---|---|---|---|
| Example 1 | Polymer 5<br>Polymer 2<br>PMMA | 130<br>50<br>20 | 160 | 20 |
| Example 2 | Polymer 5<br>Polymer 2<br>PMMA | 140<br>60<br>— | 160 | 24 |
| Example 3 | Polymer 5<br>Polymer 2<br>PMMA | 120<br>80<br>— | 160 | 25 |
| Example 4 | Polymer 5<br>Polymer 2<br>PMMA | 110<br>50<br>40 | 160 | 17 |
| Example 5 | Polymer 2<br>Polymer 1<br>PMMA | 50<br>90<br>60 | 160 | 22 |
| Example 6 | Polymer 2<br>Polymer 1<br>PMMA | 60<br>140<br>— | 160 | 28 |
| Example 7 | Polymer 4<br>Polymer 2<br>PMMA | 130<br>50<br>20 | 280 | 16 |
| Example 8 | Polymer 4<br>Polymer 2<br>PMMA | 130<br>30<br>40 | 140 | 16 |
| Example 9 | Polymer 4<br>Polymer 2<br>PMMA | 120<br>20<br>60 | 160 | 15 |
| Example 10 | Polymer 4<br>Polymer 2<br>PMMA | 140<br>60<br>— | 160 | 22 |
| Example 11 | Polymer 4<br>Polymer 2<br>PMMA | 140<br>60<br>  | 280 | 21 |
| Example 12 | Polymer 4<br>Polymer 2<br>PMMA | 140<br>60<br>— | 140 | 20 |
| Example 13 | Polymer 6<br>Polymer 5<br>PMMA | 90<br>90<br>20 | 160 | 28 |
| Example 14 | Polymer 6<br>Polymer 5<br>PMMA | 100<br>100<br>— | 160 | 29 |
| Example 15 | Polymer 6<br>Polymer 4<br>PMMA | 70<br>90<br>40 | 160 | 23 |
| Example 16 | Polymer 6<br>Polymer 4<br>PMMA | 100<br>100<br>— | 160 | 27 |
| Example 17 | Polymer 6<br>Polymer 3<br>PMMA | 50<br>90<br>60 | 160 | 22 |
| Example 18 | Polymer 6<br>Polymer 3<br>PMMA | 100<br>100<br>— | 160 | 34 |

Comparative Example 1

Properties of Comparative Example 1, Icosolar 2442 produced by Isovolta, as a backsheet for a photovoltaic module were evaluated. The Icosolar 2442 product was a multi-layered sheet prepared by laminating poly(vinyl fluoride) (PVF) sheets (thickness: 38 μm) prepared by extrusion on both surfaces of the PET sheet using an adhesive.

Comparative Example 2

Properties of Comparative Example 2, Icosolar 3459 produced by Isovolta as a backsheet for a photovoltaic module were evaluated. The Icosolar 2442 product was a multi-layered sheet prepared by laminating poly(vinyl fluoride) (PVF) sheets (thickness: 25 μm) prepared by casting on both surfaces of the PET sheet using an adhesive.

Experimental Example 1

After a pressure cooker test (PCT), 180-degree peel strength and cross-hatch tests were performed on each of the multi-layered sheets of Examples 1 to 18 and Comparative Examples 1 and 2. Specifically, each multi-layered sheet was left under conditions including 2 atm, 121° C. and 100% RH for 50, 75 or 100 hours, and the 180-degree peel strength and cross-hatch test were performed to evaluate the change in peel strength. The evaluation results are listed in the following Table 3.

TABLE 3

| | 180-Degree Peel Strength (N/cm) | | | | Cross-Hatch Test Result | | | |
|---|---|---|---|---|---|---|---|---|
| | Early | 50 hrs | 75 hrs | 100 hrs | Early | 50 hrs | 75 hrs | 100 hrs |
| Example 1 | Coat-T | Coat-T | Coat-T | PET-T | 5B | 5B | 5B | PET-T |
| Example 2 | Coat-T | Coat-T | Coat-T | PET-T | 5B | 5B | 5B | PET-T |
| Example 3 | Coat-T | 4.9 | 4.4 | 3.9 | 5B | 5B | 4B | PET-T |
| Example 4 | Coat-T | Coat-T | Coat-T | PET-T | 5B | 5B | 4B | PET-T |
| Example 5 | Coat-T | Coat-T | Coat-T | PET-T | 5B | 5B | 5B | PET-T |
| Example 6 | Coat-T | Coat-T | 3.2 | PET-T | 5B | 5B | 5B | 4B |

TABLE 3-continued

|  | 180-Degree Peel Strength (N/cm) | | | | Cross-Hatch Test Result | | | |
| --- | --- | --- | --- | --- | --- | --- | --- | --- |
|  | Early | 50 hrs | 75 hrs | 100 hrs | Early | 50 hrs | 75 hrs | 100 hrs |
| Example 7 | Coat-T | Coat-T | Coat-T | PET-T | 5B | 5B | 5B | PET-T |
| Example 8 | Coat-T | Coat-T | Coat-T | PET-T | 5B | 5B | 4B | PET-T |
| Example 9 | Coat-T | Coat-T | Coat-T | PET-T | 5B | 5B | 4B | PET-T |
| Example 10 | Coat-T | Coat-T | Coat-T | PET-T | 5B | 5B | 5B | PET-T |
| Example 11 | Coat-T | Coat-T | Coat-T | PET-T | 5B | 5B | 4B | PET-T |
| Example 12 | Coat-T | Coat-T | Coat-T | PET-T | 5B | 5B | 4B | PET-T |
| Example 13 | Coat-T | Coat-T | Coat-T | PET-T | 5B | 5B | 5B | PET-T |
| Example 14 | Coat-T | Coat-T | Coat-T | PET-T | 5B | 5B | 5B | PET-T |
| Example 15 | Coat-T | Coat-T | Coat-T | PET-T | 5B | 5B | 5B | PET-T |
| Example 16 | Coat-T | Coat-T | 3.7 | PET-T | 5B | 5B | 5B | PET-T |
| Example 17 | Coat-T | Coat-T | Coat-T | PET-T | 5B | 4B | 5B | PET-T |
| Example 18 | Coat-T | Coat-T | 3.9 | PET-T | 5B | 4B | 5B | PET-T |
| Comparative Example 1 | PVF-T | PVF-T | PVF-T | 0 | 5B | 5B | 1B | 0B |
| Comparative Example 2 | 7 | 0.5 | 0 | 0 | 5B | 1B | 1B | 0B |

Coat-T: Measurement of exact peel strength was impossible because fluorine-based resin layer was torn during peeling.
PET-T: Measurement of exact peel strength was impossible because PET was torn during peeling.
PVF-T: Measurement of exact peel strength was impossible because PVF sheet was torn during peeling.

As shown in Table 3, in the multi-layered sheets of Examples of the present invention, the fluorine-based resin layer exhibited strong early adhesion to the substrate (PET) and excellent adhesion after 100-hour PCT. In addition, after the 100-hour PCT, external changes such as yellowing, interfacial peeling and pin hole formation were not observed on the fluorine-based resin layer. However, a significant decrease in adhesion to the substrate was observed from the Icosolar 2442 and 2469, which are the commercially available multi-layered sheets as the PCT continued to be performed.

Experimental Example 2

After a damp heat test, 180-degree peel strength and cross-hatch tests were performed on each of the multi-layered sheets of Examples 1 to 18 and Comparative Examples 1 and 2. Specifically, each multi-layered sheet was baked in an oven at 85° C. and 85% RH for 1000, 2000 or 3000 hours, and then the 180-degree peel strength and cross-hatch tests were performed to evaluate the change in peel strength. The evaluation results are listed in the following Table 4.

TABLE 4

|  | 180-degree Peel Strength (N/cm) | | | | Cross-Hatch Test Result | | | |
| --- | --- | --- | --- | --- | --- | --- | --- | --- |
|  | Early | 1000 hrs | 2000 hrs | 3000 hrs | Early | 1000 hrs | 2000 hrs | 3000 hrs |
| Example 1 | Coat-T | Coat-T | Coat-T | PET-T | 5B | 5B | 5B | 5B |
| Example 2 | Coat-T | Coat-T | Coat-T | PET-T | 5B | 5B | 4B | 4B |
| Example 3 | Coat-T | Coat-T | 3.8 | PET-T | 5B | 5B | 4B | PET-T |
| Example 4 | Coat-T | Coat-T | Coat-T | PET-T | 5B | 5B | 4B | PET-T |
| Example 5 | Coat-T | Coat-T | Coat-T | PET-T | 5B | 5B | 5B | PET-T |
| Example 6 | Coat-T | 4.0 | 2.9 | PET-T | 5B | 5B | 4B | PET-T |
| Example 7 | Coat-T | Coat-T | Coat-T | PET-T | 5B | 5B | 5B | PET-T |
| Example 8 | Coat-T | Coat-T | Coat-T | PET-T | 5B | 5B | 5B | PET-T |
| Example 9 | Coat-T | Coat-T | Coat-T | PET-T | 5B | 5B | 5B | PET-T |
| Example 10 | Coat-T | Coat-T | 3.2 | PET-T | 5B | 5B | 5B | 3B |
| Example 11 | Coat-T | Coat-T | Coat-T | PET-T | 5B | 5B | 4B | PET-T |
| Example 12 | Coat-T | Coat-T | 2.7 | PET-T | 5B | 5B | 2B | PET-T |
| Example 13 | Coat-T | Coat-T | Coat-T | PET-T | 5B | 5B | 5B | PET-T |
| Example 14 | Coat-T | Coat-T | 4.4 | PET-T | 5B | 5B | 5B | PET-T |
| Example 15 | Coat-T | Coat-T | Coat-T | PET-T | 5B | 5B | 5B | PET-T |
| Example 16 | Coat-T | Coat-T | 3.4 | PET-T | 5B | 5B | 5B | PET-T |
| Example 17 | Coat-T | Coat-T | Coat-T | PET-T | 5B | 4B | 5B | PET-T |
| Example 18 | Coat-T | Coat-T | Coat-T | PET-T | 5B | 5B | 3B | 0B |
| Comparative Example 1 | PVF-T | PVF-T | PVF-T | 0 | 5B | 5B | 5B | 0B |
| Comparative Example 2 | 7 | 2 | 0.7 | Wrinkles | 5B | 5B | 4B | 0B |

Coat-T: Measurement of exact peel strength was impossible because fluorine-based resin layer was torn during peeling.
PET-T: Measurement of exact peel strength was impossible because PET was torn during peeling.
PVF-T: Measurement of exact peel strength was impossible because PVF sheet was torn during peeling.

As shown in Table 4, in the multi-layered sheets of Examples of the present invention, the fluorine-based resin layer exhibited strong early adhesion to the substrate (PET) and excellent adhesion after the 3000-hour damp heat test. In addition, after the 3000-hour damp heat test, external changes such as such as yellowing, interfacial peeling and pin hole formation were not observed on the fluorine-based resin layer. However, a significant decrease in adhesive strength to the substrate was observed from the Icosolar 2442 and 3469, which are the commercially available multi-layered sheets as the damp heat test continued to be performed.

BMA=8:2) instead of PMMA was used in the preparation of the coating solution.

Experimental Example 3

After the pressure cooker test (PCT) in the same manner as Experimental Example 1, the 180-degree peel strength and cross-hatch tests were performed on each of the multi-layered sheets of Examples 19 to 23, and then the results were listed in the following Table 5.

TABLE 5

|  | 180-Degree Peel Strength (N/cm) | | | | Cross-Hatch Test Result | | | |
| --- | --- | --- | --- | --- | --- | --- | --- | --- |
|  | Early | 50 hrs | 75 hrs | 100 hrs | Early | 50 hrs | 75 hrs | 100 hrs |
| Example 19 | Coat-T | Coat-T | Coat-T | PET-T | 5B | 5B | 5B | PET-T |
| Example 20 | Coat-T | Coat-T | Coat-T | PET-T | 5B | 5B | 4B | PET-T |
| Example 21 | Coat-T | Coat-T | Coat-T | PET-T | 5B | 5B | 5B | PET-T |
| Example 22 | Coat-T | Coat-T | Coat-T | PET-T | 5B | 5B | 5B | PET-T |
| Example 23 | Coat-T | Coat-T | Coat-T | PET-T | 5B | 5B | 5B | PET-T |

Coat-T: Measurement of exact peel strength was impossible because fluorine-based resin layer was torn during peeling.
PET-T: Measurement of exact peel strength was impossible because PET was torn during peeling.

Example 19

A multi-layered sheet was prepared in the same manner as Example 1, except that a copolymer of methyl methacrylate (MMA) and cyclohexyl maleimide (CHMI) (weight ratio: MMA:CHMI=9:1) instead of PMMA was used in the preparation of the coating solution.

Example 20

A multi-layered sheet was prepared in the same manner as Example 1, except that a copolymer of methyl methacrylate (MMA) and ethyl acrylate (EA) (weight ratio: MMA:EA=6:4) instead of PMMA was used in the preparation of the coating solution.

Example 21

A multi-layered sheet was prepared in the same manner as Example 1, except that a copolymer of methyl methacrylate (MMA), ethyl acrylate (EA) and methacrylonitrile (MAN) (weight ratio: MMA:EA:MAN=6:3:1) instead of PMMA was used in the preparation of the coating solution.

Example 22

A multi-layered sheet was prepared in the same manner as Example 1, except that a copolymer of methyl methacrylate (MMA), ethyl acrylate (EA), acrylonitrile (AN) and styrene (ST) (weight ratio: MMA:EA:AN:ST=5:3:1:1) instead of PMMA was used in the preparation of the coating solution.

Example 23

A multi-layered sheet was prepared in the same manner as Example 1, except that a copolymer of methyl methacrylate (MMA) and butyl methacrylate (BMA) (weight ratio: MMA:

As shown in Table 5, in the multi-layered sheets of the Examples of the present invention, the fluorine-based resin layer exhibited strong early adhesion to the substrate (PET) and excellent adhesion after the 100-hour PCT. In addition, after the 100-hour PCT, external changes such as yellowing, interfacial peeling and pin hole formation were not observed on the fluorine-based resin layer.

In the following Examples 24 to 43, the compositions of the fluorine-based resin layer were designed the same as in Example 1 or 2, and the conditions of the surface treatment of the substrate, the configuration of the polymer coating layer, and the change in coating thickness were examined.

Example 24

A multi-layered sheet was prepared in the same manner as Example 1 except that PET not treated with corona was used in the preparation of the substrate, and the application conditions were controlled so that the polymer coating layer (acryl-modified polyester layer) had a thickness of 500 nm after drying.

Example 25

A multi-layered sheet was prepared in the same manner as Example 2 except that PET not treated with corona was used in the preparation of the substrate, and the application conditions were controlled so that the polymer coating layer (acryl-modified polyester layer) had a thickness of 300 nm after drying.

Examples 26 and 27

Multi-layered sheets were prepared in the same manner as Examples 1 and 2, respectively, except that PET not treated with corona was used in the preparation of the substrate, and the application conditions were controlled so that the polymer coating layer (acryl-modified polyester layer) had a thickness of 1000 nm after drying.

Examples 28 and 29

Multi-layered sheets were was prepared in the same manner as Examples 1 and 2, respectively, except that PET treated with plasma was used in the preparation of the substrate, and the application conditions were controlled so that the polymer coating layer (acryl-modified polyester layer) had a thickness of 100 nm after drying.

Examples 30 and 31

Multi-layered sheets were prepared in the same manner as Examples 1 and 2, respectively, except that PET treated with plasma was used in the preparation of the substrate, and the application conditions were controlled so that the polymer coating layer (acryl-modified polyester layer) had a thickness of 500 or 300 nm after drying.

Examples 32 and 33

Multi-layered sheets were prepared in the same manner as Examples 1 and 2, respectively, except that PET treated with plasma was used in the preparation of the substrate, and the application conditions were controlled so that the polymer coating layer (acryl-modified polyester layer) had a thickness of 1000 nm after drying.

Example 34

A multi-layered sheet was prepared in the same manner as Example 1 except that PET treated with plasma was used in the preparation of the substrate, and a polymer coating layer was formed to have a thickness of 500 nm by applying a solution prepared by dissolving a copolymer of acrylonitrile (AN), methyl methacrylate (MMA), styrene (ST), butyl acrylate (BA) and alpha-methylstyrene (AMST) (weight ratio: 15:5:28:50:2 (AN:MMA:ST:BA:AMST)) in toluene to the plasma-treated surface and drying the applied solution.

Examples 35 and 36

Multi-layered sheets were prepared in the same manner as Example 2 except that PET treated with plasma was used in the preparation of the substrate, and a polymer coating layer was formed to have a thickness of 100 or 300 nm by applying a solution prepared by dissolving a copolymer of acrylonitrile (AN), methyl methacrylate (MMA), styrene (ST), butyl acrylate (BA) and alpha-methylstyrene (AMST) (weight ratio: 15:5:28:50:2 (AN:MMA:ST:BA:AMST)) in toluene to the plasma-treated surface and drying the applied solution.

Examples 37 and 38

Multi-layered sheets were prepared in the same manner as Examples 34 and 35, respectively, except that the thickness of the polymer coating layer after drying was controlled to 1000 nm.

Example 39

A multi-layered sheet was prepared in the same manner as Example 1 except that PET treated with plasma was used in the preparation of the substrate, and a polymer coating layer was formed to have a thickness of 500 nm by applying a solution prepared by dissolving a copolymer of methacrylonitrile (MAN), methyl methacrylate (MMA) and ethyl acrylate (EA) (weight ratio: 35:25:40 (MAN:MMA:EA)) and 1 part by weight of a crosslinking agent, p-toluene sulfonic acid (p-TSA) in toluene to the plasma-treated surface and drying the applied solution.

Examples 40 and 41

Multi-layered sheets were prepared in the same manner as Example 2 except that PET treated with plasma was used in the preparation of the substrate, and a polymer coating layer was formed to have a thickness of 100 or 300 nm by applying a solution prepared by dissolving a copolymer of methacrylonitrile (MAN), methyl methacrylate (MMA) and ethyl acrylate (EA) (weight ratio: 35:25:40 (MAN:MMA:EA)) and 1 part by weight of a crosslinking agent, p-toluene sulfonic acid (p-TSA) in toluene to the plasma-treated surface and drying the applied solution.

Examples 42 and 43

Multi-layered sheets were prepared in the same manner as Examples 39 and 40, respectively, except that the thickness of the polymer coating layer after drying was controlled to 1000 nm.

Experimental Example 4

After the PCT performed in the same manner as Experimental Example 1, the 180-degree peel strength and cross-hatch tests were performed on each of the multi-layered sheets of Examples 24 to 43, and then the results were listed in the following Table 6.

TABLE 6

|  | 180-Degree Peel Strength (N/cm) | | | | Cross-Hatch Test Results | | | |
| --- | --- | --- | --- | --- | --- | --- | --- | --- |
|  | Early | 50 hrs | 75 hrs | 100 hrs | Early | 50 hrs | 75 hrs | 100 hrs |
| Example 24 | Coat-T | Coat-T | Coat-T | PET-T | 5B | 5B | 5B | PET-T |
| Example 25 | Coat-T | 4.2 | Coat-T | PET-T | 5B | 5B | 5B | PET-T |
| Example 26 | Coat-T | Coat-T | Coat-T | PET-T | 5B | 5B | 5B | PET-T |
| Example 27 | Coat-T | Coat-T | Coat-T | PET-T | 5B | 5B | 5B | PET-T |
| Example 28 | Coat-T | Coat-T | Coat-T | PET-T | 5B | 5B | 5B | PET-T |
| Example 29 | Coat-T | 1.2 | Coat-T | PET-T | 5B | 5B | 5B | PET-T |
| Example 30 | Coat-T | Coat-T | Coat-T | PET-T | 5B | 5B | 5B | PET-T |
| Example 31 | Coat-T | Coat-T | Coat-T | PET-T | 5B | 5B | 5B | PET-T |
| Example 32 | Coat-T | Coat-T | Coat-T | PET-T | 5B | 5B | 5B | PET-T |
| Example 33 | Coat-T | Coat-T | Coat-T | PET-T | 5B | 5B | 5B | PET-T |
| Example 34 | Coat-T | Coat-T | Coat-T | PET-T | 5B | 5B | 5B | PET-T |
| Example 35 | 2 | 0.5 | 0.5 | PET-T | 5B | 0B | 0B | — |
| Example 36 | Coat-T | Coat-T | Coat-T | PET-T | 5B | 5B | 5B | PET-T |

TABLE 6-continued

|  | 180-Degree Peel Strength (N/cm) | | | | Cross-Hatch Test Results | | | |
|---|---|---|---|---|---|---|---|---|
|  | Early | 50 hrs | 75 hrs | 100 hrs | Early | 50 hrs | 75 hrs | 100 hrs |
| Example 37 | Coat-T | Coat-T | Coat-T | PET-T | 5B | 5B | 5B | PET-T |
| Example 38 | Coat-T | Coat-T | Coat-T | PET-T | 5B | 5B | 5B | PET-T |
| Example 39 | Coat-T | Coat-T | Coat-T | PET-T | 5B | 5B | 5B | PET-T |
| Example 40 | 6 | 2 | 2.1 | PET-T | 5B | 0B | 0B | — |
| Example 41 | Coat-T | Coat-T | 1.5 | PET-T | 5B | 5B | 5B | PET-T |
| Example 42 | Coat-T | Coat-T | Coat-T | PET-T | 5B | 5B | 5B | PET-T |
| Example 43 | Coat-T | Coat-T | 2 | PET-T | 5B | 5B | 5B | PET-T |

Coat-T: Measurement of exact peel strength was impossible because coating layer was torn during peeling.
PET-T: Measurement of exact peel strength was impossible because PET was torn during peeling.

As shown in Table 6, in the multi-layered sheets of the Examples of the present invention, the fluorine-based resin layer exhibited strong early adhesion to the substrate (PET) and excellent adhesion after the 100-hour PCT. In addition, after the 100-hour PCT, external changes such as yellowing, interfacial peeling and pin hole formation were not observed on the fluorine-based resin layer.

Comparative Examples 3 and 4

Multi-layered sheets were prepared in the same manner as Examples 1 and 2, respectively, except that the polymer coating layer (acryl-modified polyester layer) was not formed in the preparation of the substrate.

Comparative Examples 5 and 6

Multi-layered sheets were prepared in the same manner as Examples 1 and 2, respectively, except that plasma-treated PET was used in the preparation of the substrate and the polymer coating layer (acryl-modified polyester layer) was not formed.

Comparative Examples 7 and 8

Multi-layered sheets were prepared in the same manner as Examples 1 and 2, respectively, except that plasma-treated PET was used in the preparation of the substrate, the polymer coating layer (acryl-modified polyester layer) was not formed, but a silane coupling agent (γ-glycidoxy propyl trimethoxy silane) solution was applied to have a thickness of 600 nm after drying.

Comparative Examples 9 and 10

Multi-layered sheets were prepared in the same manner as Examples 1 and 2, respectively, except that plasma-treated PET was used in the preparation of the substrate, the polymer coating layer (acryl-modified polyester layer) was not formed, but a silane coupling agent (methacryloxypropyl triethoxy silane) solution was applied to have a thickness of 600 nm after drying.

Comparative Examples 11 and 12

Multi-layered sheets were prepared in the same manner as Examples 1 and 2, respectively, except that plasma-treated PET was used in the preparation of the substrate, the polymer coating layer (acryl-modified polyester layer) was not formed, but a silane coupling agent (N-(2-aminoethyl)-3-aminopropyl trimethoxy silane) solution was applied to have a thickness of 600 nm after drying.

Comparative Examples 13 and 14

Multi-layered sheets were prepared in the same manner as Examples 1 and 2, respectively, except that PET not treated with corona was used in the preparation of the substrate, 100 g of PVDF having a crystallinity of approximately 60% was singly dissolved in 1600 g of dimethylformamide (DMF) in the preparation of the fluorine-based resin layer coating solution.

Comparative Example 15

A multi-layered sheet was prepared in the same manner as Example 1, except that 100 g of PVDF having a crystallinity of approximately 60% and 20 g of PMMA were dissolved in 1600 g of DMF in the preparation of the fluorine-based resin layer coating solution.

Comparative Example 16

A multi-layered sheet was prepared in the same manner as Example 2, except that 100 g of PVDF having a crystallinity of approximately 60% was dissolved in 1600 g of DMF in the preparation of the fluorine-based resin layer coating solution.

Comparative Example 17

A multi-layered sheet was prepared in the same manner as Example 1, except that plasma-treated PET was used in the preparation of the substrate and 100 g of PVDF having a crystallinity of approximately 60% and 20 g of PMMA were dissolved in 1600 g of DMF in the preparation of the fluorine-based resin layer coating solution.

Comparative Example 18

A multi-layered sheet was prepared in the same manner as Example 2, except that plasma-treated PET was used in the preparation of the substrate and 100 g of PVDF having a crystallinity of approximately 60% was dissolved in 1600 g of DMF in the preparation of the coating solution.

Experimental Example 5

After a 25-hour damp heat test was performed on the multi-layered sheets of Comparative Examples 3 to 18 in the same manner as Experimental Example 2, the 180-degree peel strength and cross-hatch tests were performed thereon, and the results are listed in the following Table 7.

TABLE 7

| | 180-Degree Peel Strength (N/cm) | | Cross-Hatch Test Results | |
|---|---|---|---|---|
| | Early | 25 hrs | Early | 25 hrs |
| C. Example 3 | 0 | — | 0B | — |
| C. Example 4 | 0 | — | 0B | — |
| C. Example 5 | 0 | — | 0B | — |
| C. Example 6 | 0 | — | 0B | — |
| C. Example 7 | 1.6 | 0 | 4B | 0B |
| C. Example 8 | 1.6 | 0 | 4B | 0B |
| C. Example 9 | 2.4 | 0 | 4B | 0B |
| C. Example 10 | 2.4 | 0 | 4B | 0B |
| C. Example 11 | 3.3 | 0 | 5B | 0B |
| C. Example 12 | 3.3 | 0 | 5B | 0B |
| C. Example 13 | 1.2 | 0 | 3B | 0B |
| C. Example 14 | 1.2 | 0 | 3B | 0B |
| C. Example 15 | 1.9 | 0 | 4B | 0B |
| C. Example 16 | 1.9 | 0 | 4B | 0B |
| C. Example 17 | 2.2 | 0 | 5B | 0B |
| C. Example 18 | 2.2 | 0 | 5B | 0B |

* C. Example: Comparative Example

As shown in Table 7, it is confirmed that when the polymer coating layer was not formed, or was formed but not interdiffused because of a high crystallinity, the adhesive strength after the damp heat test was decreased.

The embodiments of the present invention provides a multi-layered sheet in which a resin layer including a fluorine-based resin has excellent durability and weather resistance, and also exhibits a high strength of adhesion to a substrate or polymer coating layer. In addition, in the embodiments of the present invention, the multi-layered sheet can be prepared at a low drying temperature at a low cost using a low boiling point solvent. Further, its producibility can be enhanced and degradation in the quality of a product caused by thermal deformation or thermal shock can be prevented. Since such a multi-layered sheet can be effectively used as, for example, a backsheet for a photovoltaic cell, a photovoltaic module having excellent durability throughout long-term exposure to the outdoor environment may be provided.

While the invention has been shown and described with reference to certain exemplary embodiments thereof, it will be understood by those skilled in the art that various changes in form and details may be made therein without departing from the scope of the invention as defined by the appended claims.

What is claimed is:

1. A multi-layered sheet comprising:
a substrate; and
a fluorine-based resin layer,
wherein the multi-layered sheet further comprises a polymer coating layer that is compatible with a fluorine-based resin between the substrate and the fluorine-based resin layer,
wherein the fluorine-based resin layer includes a fluorine-based resin having an amorphous region and having a crystallinity of 10% to 50%,
wherein the fluorine-based resin is a copolymer including vinylidene fluoride and a comonomer in a polymerized type or a branched polymer,
wherein the comonomer in the copolymer is 10 to 30 wt % based on the total weight of the copolymer, and
wherein the overall crystallinity of the fluorine-based resin layer is 10 to 35%.

2. The multi-layered sheet according to claim 1, wherein the polymer coating layer is formed on the substrate, a polymer in the polymer coating layer includes a main chain backbone that is compatible with the fluorine-based resin, and the fluorine-based resin layer is formed on the polymer coating layer.

3. The multi-layered sheet according to claim 2, wherein the main chain backbone includes at least one selected from the group consisting of (meth)acryl-based, urethane-based, ether-sulfone-based, ether imine-based, amide-based, polyester-based, aliphatic polyester-based, polyester urethane-based, (meth)acrylamide-based, urea-based, and polycarbonate-based main chain backbones; backbones of free radical addition polymers induced from monomer mixtures including a (meth)acryl-based monomer, a (meth)acrylamide-based monomer or a vinyl-based monomer as a main component.

4. The multi-layered sheet according to claim 2, wherein the polymer coating layer further includes a functional group, the functional group including at least one selected from the group consisting of a carboxyl group, a sulfonic acid group an aziridine group, an acid anhydride group, an amine group, an isocyanate group, a cyanuramide group, an epoxy group, a hydroxy group, an ester functional group, a carbamate functional group, an amide group, a urea group, an imide group, a phosphate group, a phosphoric acid group, a cyano group, a cyanate group and an imine group.

5. The multi-layered sheet according to claim 1, wherein the polymer coating layer includes a functional group having an equivalent weight of 800 to 30000.

6. The multi-layered sheet according to claim 1, wherein the polymer coating layer has a thickness of 10 to 5000 nm.

7. The multi-layered sheet according to claim 1, wherein the comonomer in the copolymer is selected from the group consisting of hexafluoropropylene (HFP), chlorotrifluoroethylene (CTFE), tetrafluoroethylene (TFE), trifluoroethylene, hexafluoroisobutylene, perfluorobutylethylene, perfluoromethylvinylether (PMVE), perfluoro-2,2-dimethyl-1,3-dioxol (PDD) and perfluoro-2-methylene-4-methyl-1,3-dioxolane (PMD).

8. The multi-layered sheet according to claim 1, wherein the fluorine-based resin has a weight average molecular weight of 50,000 to 1,000,000.

9. The multi-layered sheet according to claim 1, wherein the fluorine-based resin has a fusing point of 80 to 175° C.

10. The multi-layered sheet according to claim 1, wherein the fluorine-based resin layer further includes an amorphous resin.

11. The multi-layered sheet according to claim 10, wherein the amorphous resin is a homopolymer or copolymer including a polymerized type of at least one monomer selected from the group consisting of methyl (meth)acrylate, ethyl (meth)acrylate, propyl (meth)acrylate, butyl (meth)acrylate and isobornyl (meth)acrylate.

12. The multi-layered sheet according to claim 1, wherein the fluorine-based resin layer further includes a pigment, filler, UV stabilizer, thermal stabilizer or barrier particle.

13. The multi-layered sheet according to claim 1, wherein the fluorine-based resin layer has a thickness of 3 to 50 μm.

14. The multi-layered sheet according to claim 1, wherein the substrate is aluminum, iron; or a single sheet, stacked sheet or coextrusion product of polyethylene terephthalate (PET), polyethylene naphthalate (PEN) or polybutylene terephthalate (PBT).

15. The multi-layered sheet according to claim 1, wherein at least one surface of the substrate is subjected to at least one surface treatment selected from plasma treatment, corona treatment, primer treatment, anchor agent treatment, coupling agent treatment and thermal treatment.

16. The multi-layered sheet according to claim 1, wherein the substrate has a thickness of 50 to 500 μm.

17. A method of preparing a multi-layered sheet of claim 1, comprising:
  preparing a substrate;
  forming a polymer coating layer by coating a polymer composition that is compatible with a fluorine-based resin on the substrate; and
  coating a coating solution including a fluorine-based resin having a amorphous region and having a crystallinity of 10% to 50% and a solvent having a boiling point of 200° C. or less on the polymer coating layer,
  wherein the fluorine-based resin is a copolymer including vinylidene fluoride and comonomer in a polymerized type or a branched polymer, and
  wherein the comonomer in the copolymer is 10 to 30 wt % based on the total weight of the copolymer.

18. A backsheet for a photovoltaic cell comprising the multi-layered sheet according to claim 1.

* * * * *